United States Patent [19]

Picquendar et al.

[11] Patent Number: 4,543,547

[45] Date of Patent: Sep. 24, 1985

[54] DEMODULATION FILTER FOR A SIGNAL MODULATED IN BINARY FREQUENCY MANNER

[75] Inventors: Jean-Edgar Picquendar, Saint Remy les Chevreuse; Jeannine Henaff, Clamart; Michel Feldmann, Paris, all of France

[73] Assignee: L'Etat Francais, Issy les Moulineaux, France

[21] Appl. No.: 485,282

[22] Filed: Apr. 15, 1983

[30] Foreign Application Priority Data

Apr. 16, 1982 [FR] France ................ 82 06598

[51] Int. Cl.[4] .................. H03H 9/145; H03H 9/64
[52] U.S. Cl. ................... 333/193; 333/154; 333/196; 375/45; 329/116
[58] Field of Search ............... 333/150–155, 333/193–196; 310/313 R, 313 A, 313 B, 313 C, 313 D; 375/23, 42, 45–58, 88, 94, 25, 27, 34, 96; 329/116–119, 137, 145, 204; 364/724, 725, 728, 819, 821

[56] References Cited

U.S. PATENT DOCUMENTS 3,891,929  6/1975  Carr et al. ............ 333/196 X
4,217,563  8/1980  Vale .................... 333/150
4,291,275  9/1981  Nossen .................. 375/89
4,315,228  2/1982  Moore ................... 333/193

FOREIGN PATENT DOCUMENTS 1158969  6/1958  France .
2167405  8/1973  France .

Primary Examiner—Marvin L. Nussbaum
Attorney, Agent, or Firm—Handal & Morofsky

[57] ABSTRACT

The invention relates to a filter for demodulating signals modulated in frequency in binary manner by the switching of two frequencies $F_a$ and $F_b$.

On a piezoelectric crystal, is produced two surface wave filtering units, each comprising a transmitting transducer and a receiving transducer with interdigitated electrodes. The number of electrodes of the receiving transducer of the first unit is substantially equal to twice $(2F_a-F_b)/2(F_b-F_a)$ with a spacing of $v/(2F_a-F_b)$, in which v is the propagation rate. In the case of the second unit, this number is approximately twice $(2F_b-F_a)/2(F_b-F_a)$ with a spacing of $v/(2F_b-F_a)$. The receiving transducers are preferably subdivided in each case into two juxtaposed transducers, whereof one is set back with respect to the other by a distance of approximately $v/4F_a$ for the first unit and $v/4F_b$ for the second.

7 Claims, 13 Drawing Figures

DEMODULATION FILTER FOR A SIGNAL MODULATED IN BINARY FREQUENCY MANNER

BACKGROUND OF THE INVENTION

The present invention relates to demodulators able to restore a binary code with which an analog signal has been coded, by allocating to the latter two separate frequencies $F_a$ and $F_b$, each corresponding to a given binary state of the code. Thus, such a demodulator receives an analog signal in the form of a succession of sinusoid trains, whose frequency is either $F_a$ or $F_b$, and has to supply a succession of logic levels corresponding to the succession of frequencies reaching it. It is therefore a binary frequency modulated signal demodulator or frequency shift keying (F.S.K.) demodulator, meaning coding by frequency shift.

Such F.S.K. demodulators are more particularly used in telephony for transmitting a binary code by two frequencies (in practice 1300 and 2100 Hz) in the audible spectrum, which is compatible with the pass band of the telephone lines. These demodulators use switched capacitor filters and charge transfer filters.

Conversion to much higher frequencies is not possible in view of the frequency limitations of such filters. However, it is necessary to pass to very high coding frequencies $F_a$ and $F_b$ in the case when it is wished to transmit a high binary information flow rate. Thus, if the coding frequencies are 1300 and 2100 Hz, it is necessary to have a minimum of one signal cycle at 1300 Hz to recognize whether it is the frequency 1300 Hz and not the frequency 2100 Hz. Thus, the binary information flow rate is limited to a maximum of 13 bits/second.

A much higher flow rate is required for a large number of applications, such as satellite telecommunications for television signal transmission, multiplexed telephone communications, numerized sound, teletexts, etc. A typically desired flow rate is 2.048 megabits/second.

It would be possible to use inductor and capacitor filters, which can easily operate at high frequencies. However, these are in fact recursive filters, which therefore have a long and theoretically infinite pulse response and it is clear that if the information flow rate is high at the input, there is a significant risk of interference between two successive binary informations passing through the filters, this risk increasing as the filters become more selective. As the selectivity is made necessary by the proximity of the frequencies $F_a$ and $F_b$ to be discriminated, due to the fact that it is wished to reduce to the greatest possible extent the band width of the frequency modulation, a dead-end is reached if it is wished to obtain both a very high binary information flow rate and a limited width modulation.

In order to solve these different problems, the present invention proposes a filter for the demodulation of a signal modulated in frequency according to a binary code with two frequencies $F_a$ and $F_b$ ($F_b$ higher than $F_a$), wherein the filter comprises on the surface of a piezoelectric crystal, two acoustic surface wave filtering units using interdigitated or split-finger electrode transducers deposited on the crystal, said units receiving in both cases analog signal to be demodulated and having a finite pulse response, whose duration is substantially equal to $0.5/(F_b-F_a)$, the first filtering unit having a frequency response curve with a very high relative attenuation at frequency $F_b$ and a relatively low attenuation at frequency $F_a$, whilst the second filtering unit has a frequency response curve with a relatively high attenuation at frequency $F_a$ and a relatively low attenuation at frequency $F_b$.

Throughout the remainder of the description and the claims, the term "relative" attenuation means the attenuation with respect to the maximum of the frequency response curve, said maximum having an attenuation taken as hypothetically equal to zero decibel.

The split-finger electrode transducers deposited on the crystal comprise, for each filtering unit, a transmitting transducer having a small number of interdigitated electrodes with a principle all the same length (unmodulated transducer) and a receiving transducer having a much larger number of interdigitated electrodes extending over a width (in the direction perpendicular to the electrodes) substantially equal to $0.5\ v/(F_b-F_a)$, in which v is the propagation of the waves on the surface of the crystal, i.e. approximately 3000 m/s, as a function of the crystal used. The receiving transducer may be unmodulated (electrodes all of the same length) or modulated (electrodes of variable lengths) to modify the shape of the frequency response curve.

In particular, the receiving transducer can be modulated so as to have two groups of fingers separated by an empty space, the width of the complete transducer remaining substantially the same.

Obviously, due to the reciprocity, it is possible to interchange the characteristics of the transmitting and receiving transducers, whilst the overall pulse response, like the overall frequency response remain unchanged.

The spacing between two consecutive electrodes of the same potential is regular. This applies to the transmitting transducer and the receiving transducer of the same filtering unit. It is preferably substantially equal to $v/(2F_1-F_b)$ for the first filtering unit, for reasons which will be explained hereinafter, and $v/(2F_b-F_a)$ for the second filtering unit.

According to a special embodiment, each filtering unit comprises a transmitting transducer and two receiving half-transducers facing the transmitting transducer. The two receiving half-transducers are identical, but one is moved back with respect to the other in the direction perpendicular to the transducer electrodes by a distance substantially equal to $v/4F_a$ for the first filtering unit and $v/4F_b$ for the second. In practice, these distances can be made approximately equal to a quarter of the spacing between two consecutive electrodes of the same potential of the receiving half-transducers. Thus, for each filtering unit, two half-filters are obtained, which supply identical signals in phase quadrature, which can be raised to the square (by passing through diodes) and added to bring about a particularly simple and effective detection.

The demodulation filter according to the invention has the advantage of considerable ease of manufacture, good stability and a possibility of high speed demodulation (low bit time—modulation band width product, compatible with a good propability of detection in the presence of noise).

BRIEF DESCRIPTION OF THE DRAWINGS

The invention is described in greater detail hereinafter relative to non-limitative embodiments and with reference to the attached drawings, wherein show.

DETAILED DESCRIPTION OF THE INVENTION

Figure 1:
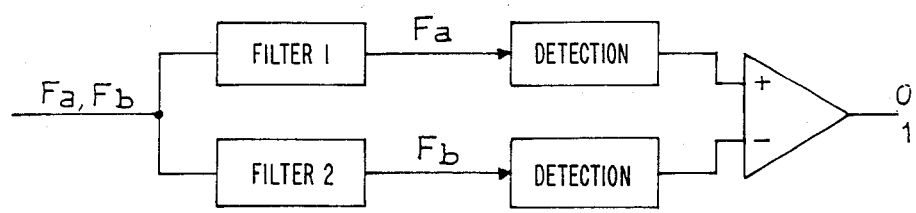
FIG. 1 a highly simplified circuit diagram of the F.S.K. demodulator.

F.S.K. demodulation requires the separation of the analog signal received into two filtering channels, one attenuating the frequency $F_b$ more than the frequency $F_a$ and the other carrying out the opposite direction. The detection of the presence or absence of a signal on each channel and the comparison of the detected signals makes it possible to restore the succession of binary information used for coding the analog signal (FIG. 1).

According to the invention, two surface wave filtering units are produced on the same piezoelectric crystal and they carry out z transfer functions with a finite pulse response, having transmission zeros allocated to appropriately chosen frequencies with respect to $F_a$ and $F_b$ and effecting the attenuation of each of these frequencies with respect to the other.

Figure 2:
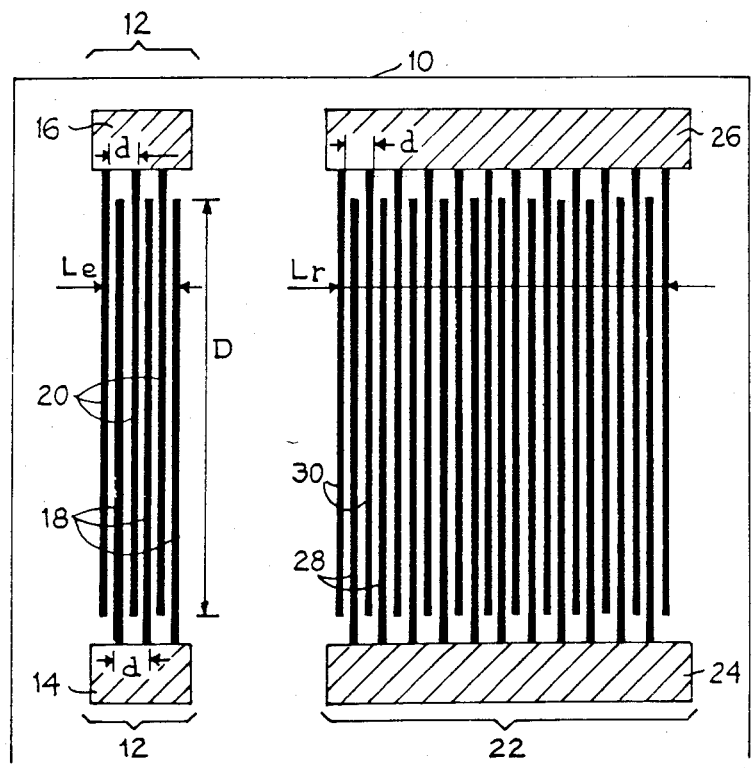
FIG. 2 a plan view of a surface wave device.

An embodiment of a surface wave device which can be used in a filtering unit is shown in the larger-scale view of FIG. 2. This unit comprises two transducers in the form of interdigitated electrode transducers deposited on the polished surface of a piezoelectric crystal 10.

A transmitting transducer 12 has two metal contact pieces 14, 16, between which is applied the analog voltage to be filtered. To contact piece 14 are connected a plurality of electrodes or teeth in the form of elongated parallel rectilinear tapes or bands 18, spaced by a constant spacing d. To contact piece 16 are connected the same number of electrodes in the form of parallel rectilinear tapes or bands 20, spaced by the same constant spacing d and positioned strictly equidistantly of electrodes 18. The width of an electrode is preferably d/4, but each electrode can be broken down into two separate electrodes of width substantially equal to d/8 (to eliminate reflections within the transducers).

Electrodes 18 do not reach contact piece 16 and electrodes 20 do not reach contact piece 14, but they still extend over most of the gap between the two contact pieces and the overlap distance D between two consecutive electrodes is the same for all of them. This latter point characterizes an unmodulated transducer. Distance D could vary for different pairs of electrodes, in which case a modulated transducer would be obtained.

A receiving transducer 22, constructed in the same way as the transmitting transducer 12, with two contact pieces 24, 26, electrodes 28 connected to contact piece 24 and electrodes 30 connected to contact piece 26, is arranged facing transmitting transducer, the electrodes of the two transducers being parallel and facing one another. The spacing of electrodes 28 and electrodes 30 is in principle the same as the spacing of electrodes 18 and 20. In this case, the receiving transducer is not modulated, but could be modulated by interrupting the electrodes at given points.

The transmitting transducer has a width $L_e$ (perpendicular to the electrodes) which is much smaller than the width $L_r$ of the receiving transducer, i.e. it has far fewer electrodes.

These two transducers 12 and 22 deposited on the crystal constitute a transmission device in the sense that the voltage applied between terminals 14 and 16 produces strains in the piezoelectric crystal, which are propagated on the surface in the direction perpendicular to the rectilinear electrodes. These strains pass beneath the receiving transducer, where they produce electrical field variations detected by the electrodes, in such a way that an output voltage appears between contact pieces 24 and 26.

Figure 3:
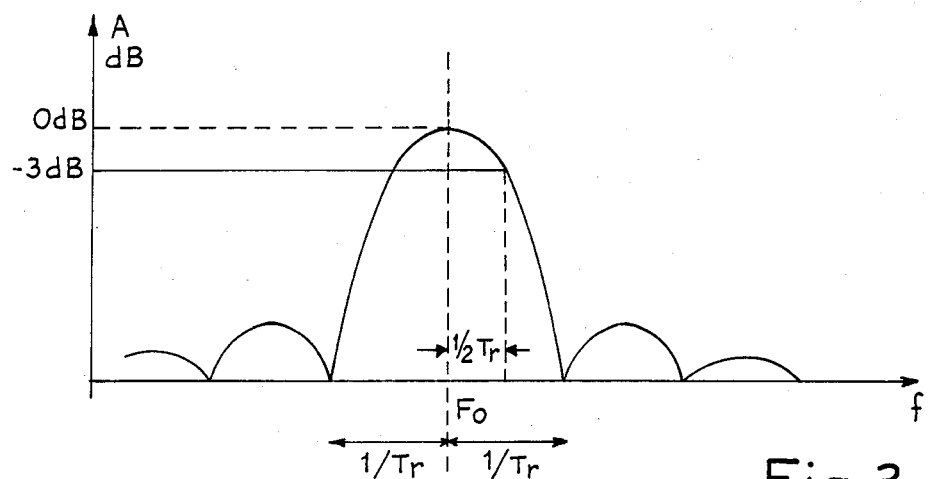
FIG. 3 the frequency response curve of the device of FIG. 2.

The frequency response curve of such a device with unmodulated transducers is shown in FIG. 3. This response curve is in a module of sin x/x. It has a maximum (zero decibel attenuation by definition) at a frequency $F_O$, which is equal to v/d, if v is the propagation rate of the surface waves and d the spacing of the electrodes connected to the same contact piece.

The response curve of FIG. 3 has "zeros" (maximum attenuation), particularly at frequencies spaced from frequency $F_O$ by a value, which is the inverse of the pulse response time Tr of the device. However, this time is equal to the time taken by an acoustic pulse to completely traverse the receiving transducer, namely at $L_r/v$. The transmission zeros of the device are consequently at a distance $1/T_r = v/L_r$ from the frequency $F_O$.

In actual fact, the response curve of the device must be broken down into a response curve of the receiving transducer having the characteristics indicated hereinbefore, and a response curve of the transmitting transducer, having an identical form and centred on frequency $F_O$, because the spacing d of the electrodes is the same. However, it is much more spread-out in width, because the transmitting transducer is much shorter than the receiving transducer and its transmission zeros are rejected at frequencies $F_O + v/L_e$ and $F_O - v/L_e$, which are very remote from $F_O$. It will therefore be considered that the transmitting transducer has a flat response in the band which is of interest and which is located around the major lobe of the response curve of the receiving transducer, and that the pulse response of the unit is that of the receiving comb.

Finally, the frequency response curve has a three decibel attenuation for the frequencies $F_O + \frac{1}{2}T_r$ and $F_O - \frac{1}{2}T_r$.

The frequency response of the thus described device is consequently essentially determined by the spacing of the electrodes (which fixes $F_O$) and the length of the receiving transducer (which fixes the transmission zeros).

Although the response curve of this device does not have steep sides and a flat top, it has the major interest for the present invention of having a particularly short pulse response for a fixed value of the desired transmission zeros. In other words, if it is wished to produce a filter with the same transmission zeros, but with a response curve having a flatter top and steeper sides, it could be obtained with a receiving transducer modulated in an appropriate manner, but this transducer would have an excessive number of electrodes and would therefore have a much longer pulse response, which a high risk of interference between the binary symbols received. This device according to FIG. 2 is consequently advantageously used as a filter within the scope of the invention.

Figure 4:
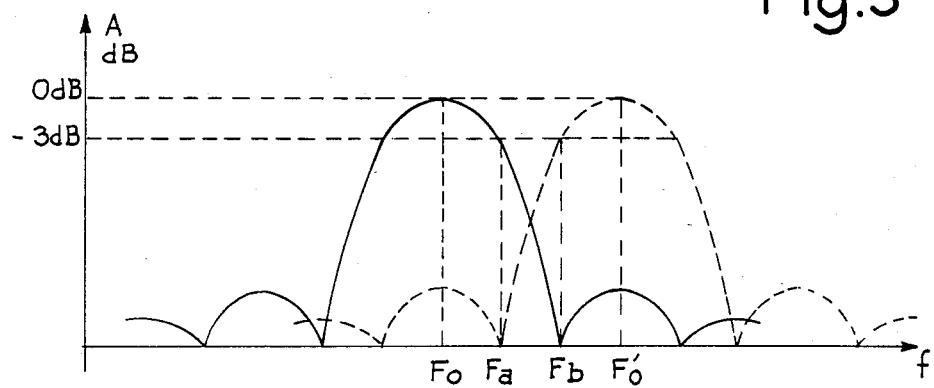
FIG. 4 juxtaposed response curves of two devices, like that of FIG. 2.

According to a first aspect of the invention, on the same substrate two filtering units with unmodulated transducers in accordance with FIG. 2 are formed, but their characteristics are such that their response curves are laterally displaced in the frequency in order to give the two curves in the form of continuous lines (first filter) and broken lines (second filter) in FIG. 4.

As the two frequencies to be demodulated $F_a$ and $F_b$ are imposed, the centre frequency of the first filter is chosen as $F_O = F_a - (F_b - F_a)$. Thus, the spacing between the electrodes of the transmitting transducer and the receiving transducer is $d = v/F_O = v/(2F_a - F_b)$. Moreover, the pulse response time $T_r$ is chosen such that $1/T_r = 2(F_b - F_a)$.

This leads to a receiving transducer width of $L_r = vT_r = v/2(F_b - F_a)$. Thus, there must be a number of electrodes equal to $(2F_a - F_b)/2(F_b - F_a)$, connected to each contact piece of the receiving transducer, i.e. in all $(2F_a - F_b)/(F_b - F_a)$.

This choice of the spacing $d$ and the number of electrodes of the receiving transducer fixes a zero for the first filter and consequently a very considerable attenuation at frequency $F_b$ and a relatively small attenuation at 3 dB at frequency $F_a$, which is in the center of the gap $(F_O, F_b)$.

The second filter is produced on the same piezoelectric crystal with a spacing between electrodes of $d' = v/2F_b - F_a$ giving a minimum attenuation at $(2F_b - F_a)/2(F_b - F_a)$ and the number of electrodes of the receiving transducer is chosen equal to $(2F_b - F_a)/2(F_b - F_a)$ for each contact piece, so as to obtain the same transducer width as for the first filter: $L'_r = L_r = v/2(F_b - F_a)$, i.e. a pulse response time of $T'_r = T_r = \frac{1}{2}(F_b - F_a)$.

As has been seen in FIG. 4, these parameters $d'$ and $L'_r$ chosen for the second filter impose a transmission zero at frequency $F_a$ and a relatively small attenuation at frequency $F_b$ (3 dB).

Thus, each of the filters receiving the frequencies $F_a$ and $F_b$ only selects one of the frequencies and very considerably attenuates the other.

Thus, with two imposed frequencies $F_a$ and $F_b$ it has been possible to determine the characteristics of the two filters, making it possible to carry out in a very satisfactory manner the separation of the signals at these two frequencies.

As has been stated, the pulse response time of the unmodulated transducer filters is particularly short and is in this case equal to $\frac{1}{2}(F_b - F_a)$. As it is possible to receive signals modulated in binary manner with a bit time substantially equal to the pulse response without any risk of interference between the symbols, it is possible to receive signals coded at a high speed for which the bit time is $\frac{1}{2}(F_b - F_a)$. For example, if $F_b - F_a = 1$ MHz, the bit time can be 500 nanoseconds and the flow rate of the binary information received can be 2 Mbits/s.

If the frequencies $F_a$ and $F_b$ are respectively 70 and 71 MHz and if the crystal chosen is lithium niobate LiNbO$_3$ ($v = 3490$ m/s), the first filter will have a receiving transducer with twice 34 or 35 interdigitated electrodes, whereof the spacing is 50.5 microns, which is preferably feasible. Thus, the second filter will have twice 36 electrodes with a spacing of 48 microns.

The number of electrodes of the transmitting transducers must be small compared with that of the receiving transducers and can be twice 3 to 10 electrodes. It is chosen so as to produce an adequate vibratory mechanical energy in the crystal.

With respect to the length of the electrodes, it is also made sufficient to ensure both an adequate energy production and recovery and a good propagation directivity (perpendicular to the electrodes). A length between one and a few millimeters is adequate. The width of the electrodes is preferably $d/4$.

Figure 5A:
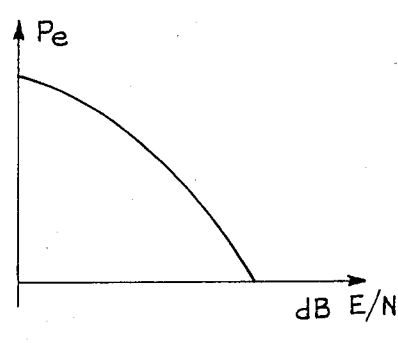
FIGS. 5a and 5b curves explaining the variations in the probability of error detection.

It can be shown that the choice of these filters is optimum from the standpoint of the probability of decoding errors with a high flow rate in the presence of white noise. It has been established by V. A. Kotelnikov in "The theory of optimum noise immunity", Dover Inc., New York, that this probability of error Pe decreases (curve of FIG. 5a) with a parameter E/N representing the ratio of the energy per bit to the spectral density of noise, so that this parameter must, if possible, be maximized in order to minimise the probability of error. However, this parameter is a function of $(1 - \sin 2 \ldots x/2 \ldots x)$, in which x is the product of the bit time T (thus representing the transmission timing) by the variation $(F_b - F_a)$ of the modulation frequencies: $x = T(F_b - F_a)$.

Figure 5B:
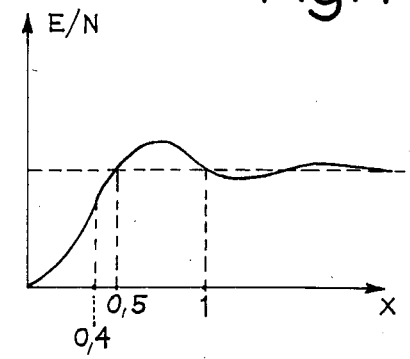

The variation curve of E/N as a function of x is shown in FIG. 5b, where it has a maximum for x approximately equal to 0.7. The curve of x undulates, but between acceptable limit values, in such a way that, in order to have a sufficiently probability of error, x must be chosen higher e.g. than 0.4 (below this E/N would decrease too much and the probability of error would increase greatly). However, whilst remaining above this value, it is best for x to be as low as possible, because increasing x means either increasing T and consequently reducing the flow rate, or increasing $F_a - F_b$ and consequently increasing the modulation band width, giving only a limited advantage in terms of error probability reduction.

Consequently, $x = 0.5$ is a very appropriate value for obtaining a low probability of error and it is this value which is obtained here, when choosing a bit time T equal to the pulse response time $T_r$ (to minimize interference between the symbols): $x = T(F_b - F_a) = T_r(F_b - F_a)$ with $T_r = \frac{1}{2}(F_b - F_a)$, i.e. $x = 0.5$.

These two advantages of reducing interference between the symbols and the low probability of error are not linked with the exact obtaining of a value $x = 0.5$. On the one hand $T(F_b - F_a)$ could be made approximately 0.4 without excessively increasing the error rate, so that e.g. the transmission flow would be increased. On the other hand $T_r$ could be made slightly below the bit time with a high timing level, in order to further reduce the risk of interference between the symbols, whilst retaining an adequate value of $T_r$ to ensure the recognition of the frequencies appearing at the input.

Under these conditions, variants can be conceived in which the characteristics of the filter are not completely the same as those given hereinbefore, although it is the same frequencies $F_a$ and $F_b$ which it is desired to detect.

In a first variant, it is taken that a certain noise level is present in the signal and it is not therefore really useful for the filters to attenuate the frequency $F_a$ or $F_b$ below this level. Thus, for the first filter, the transmission zero is not placed at $F_b$, but at a slightly higher value but the attenuation still remains high at $F_b$, so as to attenuate the signal up to the level of the noise. The same applies with regards to the second filter, whose transmission zero is placed slightly below $F_a$, the attenuation at frequency $F_a$ being such that the signal is attenuated to the noise level.

Figure 6:
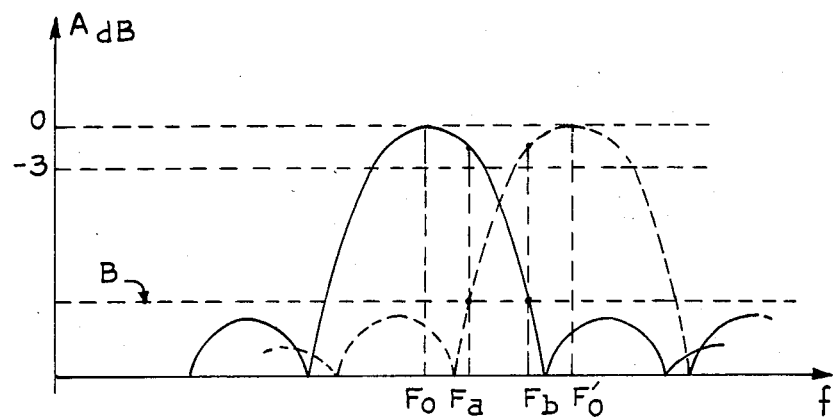
FIGS. 6 and 7 two variants of the response curves, which it is wished to obtain.

FIG. 6 shows the response curves which can result from this and a noise level example is represented by line B. Compared with FIG. 4, there has merely been a slight displacement to the right of the response curve of the first filter (continuous lines) and to the left of the second filter (broken lines).

Thus, the resulting filter comprises two filtering units having characteristics similar to those referred to in connection with FIG. 4. However, the first filter will have a centre frequency $F_O$, which is slightly higher than $2F_a - F_b$ and consequently electrodes which are positioned closer together. The receiving transducer length will be the same and consequently the number of electrodes will be slightly higher. The reverse is true for the second filter.

The resulting advantage is that the attenuation of the first filter at frequency $F_a$ and the second filter at frequency $F_b$ is below 3 dB. For example, it can be 1.5 to 2 dB and the signal-to-noise ratio at the output is consequently improved.

Figure 7:
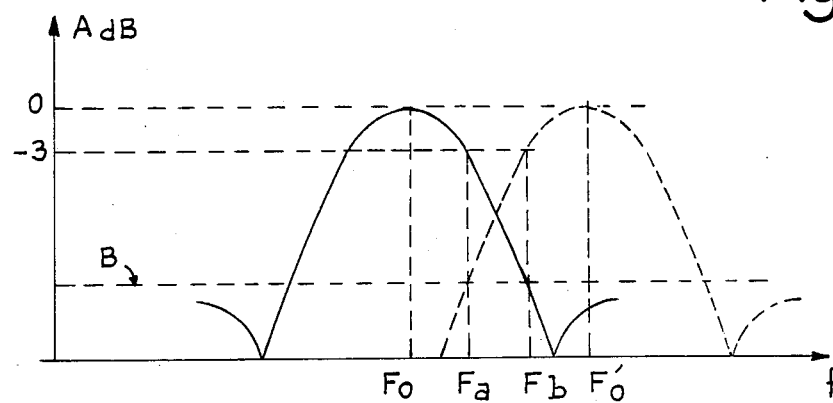

In the filter variant of FIG. 6, the same receiving transducer which is retained, so that there is a lateral displacement of the curves of FIG. 4, but without any change to their shape. In FIG. 7, account is taken of the noise in the same way, but the curves are flattened, i.e. by reducing the width of the transducer, which amounts to the same as reducing the pulse response time. In this case, the attenuation of the frequencies $F_a$ and $F_b$ is again 3 dB. The first filter will have an electrode spacing substantially equal to $v/(2F_a - F_b)$, but the transducer width will be less than $v/2(F_b - F_a)$. The same remarks apply to the second filter.

The advantage of this choice is the reduction in the pulse response time, which permits an increase in the information transmission flow, whilst remaining within acceptable conditions from the error probability standpoint.

It would naturally be possible to conceive intermediate solutions between those of FIGS. 6 and 7. In any case, the effective response curves obtained would only be approximations of the theoretical curves shown, due to the fact that e.g. the number of electrodes of the transducers, which are theoretically equal to $(2F_a - F_b)/2(F_b - F_a)$ or $(2F_b - F_a)/2(F_b - F_a)$ are in reality the whole numbers closest to these values.

In all cases, the common characteristic of the demodulation filters according to the invention with unmodulated transducers, is that their pulse response time $T_r$ or $T'_r$ is substantially equal to $0.5/(F_b - F_a)$, preferably between $0.4/(F_b - F_a)$ and $0.5/(F_b - F_a)$, with the transducer width $L_r = vT_r$ and the number of electrodes resulting therefrom.

Figure 8:
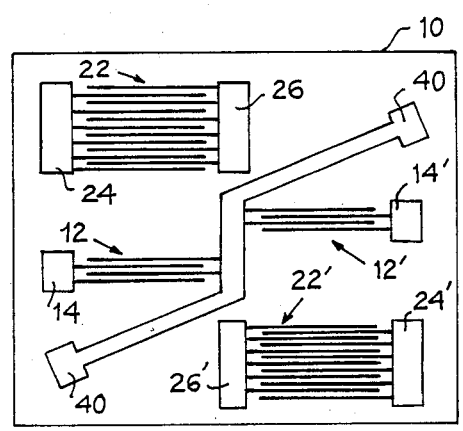
FIG. 8 a surface wave filter according to the invention having unmodulated transducers.

FIG. 8 diagrammatically shows the construction of a demodulation filter according to the invention having two filtering channels attenuating the frequencies $F_b$ and $F_a$ in accordance with the curves of FIGS. 4, 6 or 7. The numbers of electrodes shown are of a random nature.

The piezoelectric crystal can be of lithium niobate $LiNbO_3$, lithium tantalate $LiTaO_3$, quartz, berlinite, gallium arsenide, etc. The propagation speeds v of the elastic surface waves in these materials are varied and known. The crystal is designated 10, as in FIG. 2. A wide electrode 40 subdivides into two parts the surface of the crystal. It serves as an electrostatic shielding and earth line between the two channels. The electrode 40 forms a reference point for the input signal.

A first filtering unit, located on one side of electrode 40, comprises a transmitting transducer 12 with a small number of interdigitated electrodes, extending between a contact piece 14 and electrode 40, a receiving transducer 22 having a larger number of electrodes, parallel to the transmitting receiver and facing the same and extending between two contact pieces 24 and 26.

A second filtering unit is formed in the same way on the other side of electrode 40. The same references, followed by the apostrophe, designate the corresponding components. The electrode spacings and the number of electrodes are calculated in the same way as explained with reference to FIGS. 4, 6 and 7. The distance between the transmitting transducer and the receiving transducer is the same for both filtering units.

The analog signal to be demodulated is simultaneously applied to contact pieces 14 and 14' with respect to the common electrode 40. The output of the first filtering unit is taken between contact pieces 24 and 26 and that of the second between contact pieces 24' and 26'. These outputs are coupled (cf. FIG. 1) to two detectors (low-pass filters), which are connected to the inputs of a comparator.

Figure 9:
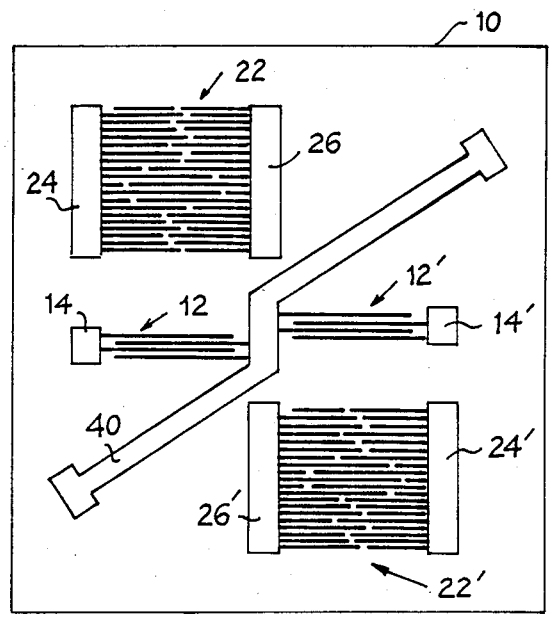
FIG. 9 a surface wave filter according to the invention with modulated receiving transducers.

A constructional variant of the F.S.K. demodulator filter according to the invention is shown in FIG. 9. The filtering units, arranged in the same way as those of FIG. 8, have the special feature of each having a modulated receiving transducer, i.e. its interdigitated electrodes are interrupted at variable heights. These interruptions make it possible to modify the response curves of 4, 6, and 7, particularly for flattening the top or even for producing bosses and obtaining steeper sides than the curve in sin x/x.

The references used in FIG. 9 are the same as for the corresponding components of FIG. 8. It is possible to see the modulated transducers 22 and 22'. Their width and electrode number are greater than those of FIG. 8 because, to enable the response curves obtained to have a flatter top or steeper side than those of an unmodulated transducer having substantially the same transmission zero and transmission center frequency positions, it is necessary to modulate the overlap lengths of consecutive electrodes over a relatively large number of components, which corresponds to a polynomial transfer function with a relatively high number of coefficients.

Figure 10:
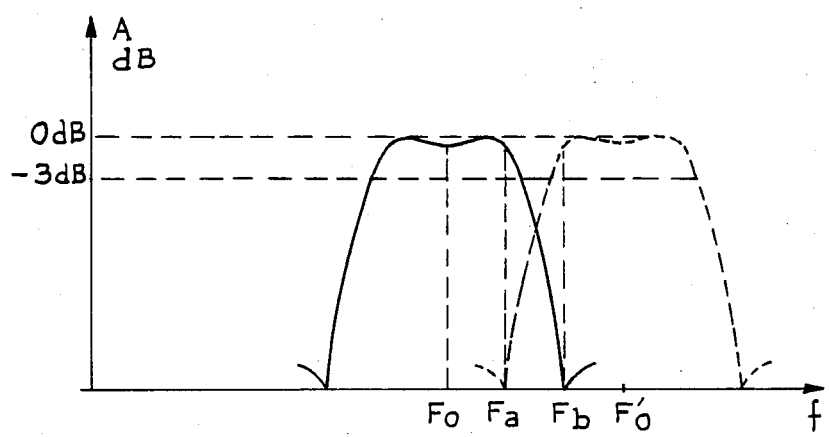
FIG. 10 response curves which can be obtained with a modulated transducer filter.

FIG. 10 shows an example of response curves supplied by two filtering units with modulated transducers. One of the curves is centred on a frequency $F_O$ substantially equal to $2F_a - F_b$ and the other on $F'_O$ substantially equal to $2F_b - F_a$, which determines the spacings of the electrodes of the two filtering units: $d = v/F_O$ and $d' = v/F'_O$.

The first filter has a zero at $F_b$ (or slightly higher in frequency, taking account of the information given in connection with FIGS. 6 and 7), and the other filter has a zero at $F_a$.

The response curves are flat and even have bosses on either side of the centre frequency, so that the attenuation of the first filter at $F_a$ and the second filter at $F_b$ is very low (less than 1 dB) which is the essential interest in having modulated transducers. The response curves can be asymmetrical and have a steeper side between $F_a$ and $F_b$ than on the other side.

However, it is very important to remember that the obtaining of a flat top and steep sides must not lead to an excessive comb width because otherwise, with a high flow rate, there would be significant interferences between the symbols. Therefore, according to the invention, there is a limitation to transducers having a pulse response of approximately $0.5/(F_b - F_a)$ and which can, for example, at the most reach double this value. This determines the number of electrodes, because the spacing of the electrodes is imposed. Thus, for a modulated transducer filter, this number is between $(2F_a - F_b)/2(F_b - F_a)$ and $(2F_a - F_b)/(F_b - F_a)$ approximately for the first filter and between $(2F_b - F_a)/2(F_b - F_a)$ and $(2F_b - F_a)/(F_b - F_a)$ approximately for the second filter.

In a particularly interesting embodiment of the invention, use is made of the fact that surface wave devices can establish not only a filtering of analog signals, but also phase displacements.

Figure 11:
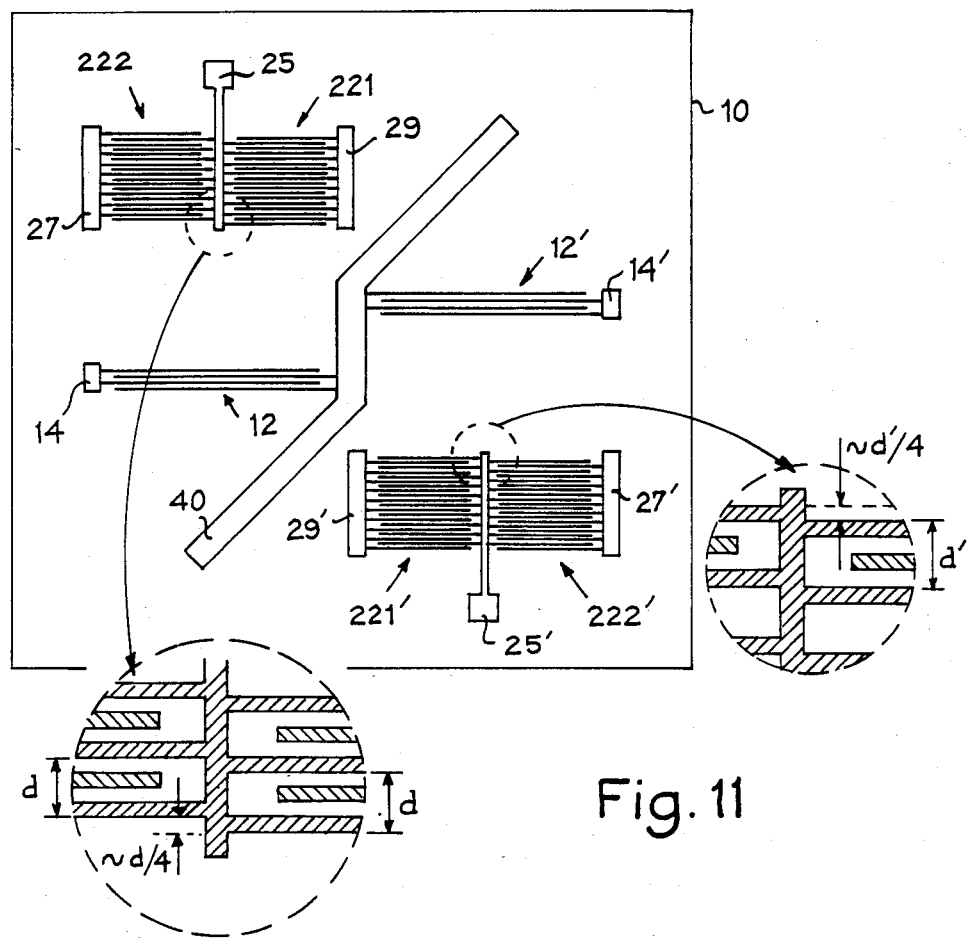
FIG. 11 a filter with two half-transducers phase-shifted in each filtering channel.

The demodulation filter of FIG. 11 is based on those of FIG. 8 or 9, but the receiving transducers of the two units have been subdivided into two. There are two receiving transducers 221 and 222 (222' and 222') facing transmitting transducer 12 (or 12'). These transducers have a common contact piece 25, located in the axis of the transmitting transducer. Electrodes extend transversely on either side of this common contact piece, but those extending on one side are displaced in the propagation direction by a distance approximately equal to d/4 compared with those extending on the other side. This displacement is clearly shown by the larger-scale details in the dotted circles of FIG. 11.

An interdigitated receiving transducer 221 is formed on one side of contact piece 25 with electrodes extending from another contact piece 27, and another transducer 222 is formed on the other side with electrodes extending from another contact piece 29. The two juxtaposed transducers occupy a length which is equivalent to that of the transmitting transducer, i.e. the receiving electrodes have a length which is in practice half the length of the transmitting electrodes. For the receiving transducers 221' and 222' of the second filtering channel, the displacement of the electrodes of the two transducers is approximately d'/4, if d' is the spacing of the electrodes of the second filtering channel.

These transducers may or may not be modulated. The spacings d and d' of the electrodes and the number of electrodes are calculated, in the manner described hereinbefore, by giving the receiving transducers a width $L_r$ in the wave propagation direction, such that the pulse response time is substantially equal to $0.5/(F_b - F_a)$, e.g. between $0.4/(F_b - F_a)$ and $0.5/(F_b - F_a)$, if the transducers are not modulated, or between $0.5/(F_b - F_a)$ and $1/(F_b - F_a)$, if they are modulated. The modulation of the transducers can have a certain number of zeros.

Figure 12:
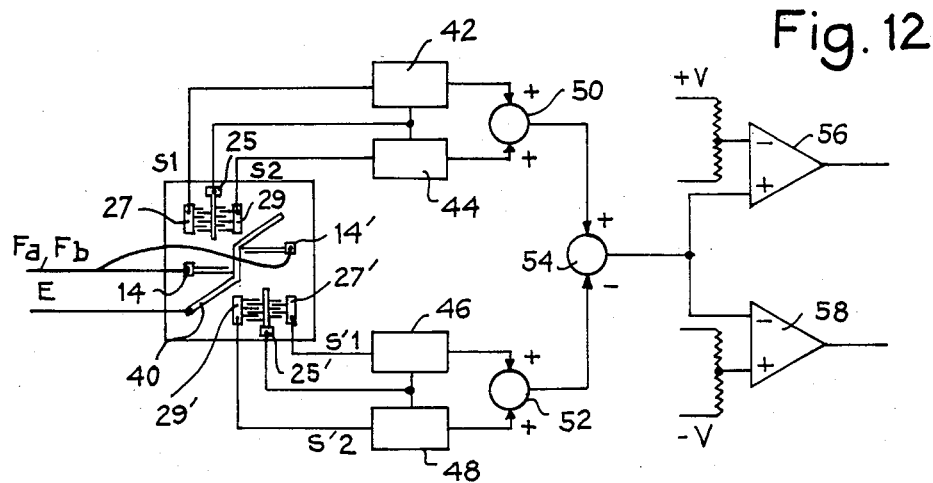
FIG. 12 a demodulator with simplified detection using the filter of FIG. 11.

The filter of FIG. 11 is used as a F.S.K. demodulator in the manner shown in FIG. 12. The input signal to be demodulated is applied simultaneously to contact pieces 14 and 14', with respect to the common contact piece 40.

Four output signals are collected, respectively a signal S1 and a signal S2 on contact pieces 27 and 29 (with respect to contact piece 25) and a signal S'1 and a signal S'2 on contact pieces 27' and 29' with respect to the common contact piece 25'.

Each of these four signals is applied to a device for raising to the square, respectively 42, 44, 46, 48, e.g. constituted by diodes.

The signals S1 and S2 raised to the square in this way are added in an adder 50 and the signals S'1 and S'2 raised to the square are added in an adder 52. The outputs of the adders are applied to the inputs of a subtractor 54, which supplies a signal having a positive or a negative side, as a function of the frequency received. This subtractor can be followed by threshold comparators 56, and 58 in order to establish an output binary signal.

The displacement of the electrodes of transducers 221 and 222 by a distance d/4 introduces a phase shift of 90° (at frequency $F_a$) between the two output signals S1 and S2 of the first filtering unit and in the same way for signals S'1 and S'2 at frequency $F_b$.

The raising to the square and the addition of the two sinusoidal signals phase-shifted by 90° amounts to forming a sum of types $\cos^2 + \sin^2$, which is equal to 1. Thus, as soon as a frequency $F_a$ is detected by the first filtering unit, output of adder 50 supplies a continuous signal in which the frequency $F_a$ has been eliminated without a low-pass filtering device. Thus, this filter with two phase-shifted half-transducers in each filtering channel permits a particularly simple detection of the frequencies $F_a$ and $F_b$, with an excellent elimination of the noise, which is raised to the square and subtracted between the two channels.

It should be noted that the displacement between the two receiving half-transducers 221 and 222 (or 221' and 222') has, for reasons of simplification, been chosen equal to d/4. In reality, in order to obtain a precisely 90° phase shift at frequency $F_a$, it is necessary to have a displacement equal to $v/4F_a$, whilst d/4 is equal to $v/4(2F_a - F_b)$.

In the same way, it is possible to adopt a displacement of the electrodes $v/4F_b$, which is more precise than $d'/4 = v/4(2F_b - F_a)$ for transducers 221' and 222'.

The demodulation filters according to the invention can be used in a frequency range between e.g. 30 and 300 MHz or even higher.

Hereinbefore, particular reference has been made to the receiving transducer with a large number of electrodes and which can be modulated, whilst the transmitting transducer has fewer electrodes and is not modulated. However, the functions of the transducers can be reversed and it is also possible for the modulation of the lengths of the electrodes to be distributed between the transmitting transducer and the receiving transducer.

What is claimed is:

1. A filter for the demodulation of a signal modulated in frequency according to a binary code with two frequencies $F_a$ and $F_b$, $F_b$ being higher than $F_a$ comprising two acoustic surface wave filtering units having interdigitated or split-finger electrode transducers deposited on the surface of a piezoelectric crystal, means for driving both units with analog signals to be demodulated and having a finite pulse response, whose duration is substantially equal to $0.5/(F_b - F_a)$, the first filtering unit having a frequency response curve with a very high relative attenuation at frequency $F_b$ and a relatively low attenuation at frequency $F_a$, the second filtering unit having a frequency response curve with a relatively high attenuation at frequency $F_a$ and a relatively low attenuation at frequency $F_b$, and associated with each of the two filtering units a transmitting transducer and two juxtaposed receiving transducers having interdigitated electrodes with the same spacing, one of the two receiving transducers having its electrodes displaced with respect to those of the other in the direction perpendicular to the electrodes, the displacement having a value of approximately $v/4F_a$ for the first filtering unit and $v/4F_b$ for the second filtering unit, in which v is the propagation rate of the surface waves.

2. A filter for the demodulation of a signal modulated in frequency according to a binary code with two frequencies $F_a$ and $F_b$, wherein $F_b$ is higher than $F_a$, said filter comprising first and second acoustic surface wave filtering units disposed on the surface of a piezoelectric crystal, each of said filtering units comprising a transmitting transducer having two contact members and several electrodes connected alternatively to said contact members and a receiving transducer having at least two contact members and a much larger number of electrodes connected alternatively to said contact members, the number of electrodes being about twice $(2F_a-F_b)/2(F_b-F_a)$ for said first unit and about twice $(2F_b-F_a)/2(F_b-F_a)$ for said second unit, the spacing of the electrodes connected to the same contact member being substantially equal to $v/(2F_a-F_b)$ for said first unit and $v/(2F_b-F_a)$ for said second unit, in which v is the propagation rate of waves on the surface of said piezoelectric crystal, said contact members of said transmitting transducer of said first and second filtering units receiving said signal, said first and second filtering units having a finite pulse response, whose duration is substantially equal to $0.5/(F_b-F_a)$, the first filtering unit having a frequency response with a very high relative attenuation at frequency $F_b$ and a relatively low attenuation at frequency $F_a$, said second filtering unit having a frequency response with a relatively high attenuation at frequency $F_a$ and a relatively low attenuation at frequency $F_b$.

3. A demodulation filter according to claim 2, wherein the receiving transducers of said first and second filtering units have electrodes of equal length, the number of said electrodes being between twice $0.8(2F_a-F_b)/2(F_b-F_a)$ and twice $(2F_a-F_b)/2(F_b-F_a)$ for the first filtering unit and between twice $0.8(2F_b-F_a)/2(F_b-F_a)$ and twice $(2F_b-F_a)/(F_b-F_a)$ for the second.

4. A demodulation filter according to claim 2, wherein the receiving transducers of said first and second filtering units have some electrodes which are not equal in length, the number of said some electrodes being between $(2F_a-F_b)/2(F_b-F_a)$ and $(2F_a-F_b)/(F_b-F_a)$ for the first filtering unit and between $(2F_b-F_a)/2(F_b-F_a)$ and $(2F_b-F_a)/(F_b-F_a)$ for the second filtering units.

5. A demodulation filter according to claim 2, wherein the surface of the piezoelectric crystal is subdivided into first and second zones by a wide electrode, said wide electrode being one of said contact pieces of said transmitting transducers and serving as an electrostatic shield between said first and second zones, the receiving transducer of said first filtering unit being in said first zone and the receiving transducer of said second filtering unit being in said second zone.

6. A demodulation filter according to claim 2, wherein each receiving transducer has first, second and third contact members, said second contact member being between said first and said third contact members.

7. A demodulation filter according to claim 2, wherein each receiving transducer of said first and second filtering units is made of first and second half-transducers having a contact member in common, said first half-transducer having electrodes on one side of said common contact member and said second half-transducer having electrodes on the other side of said common contact member, the electrodes of both said first and said second half-transducers having the same spacing, one of said half-transducers having its electrodes displaced with respect to those of the other in a direction perpendicular to the electrodes, the displacement having a value of approximately $v/4F_a$ for the first filtering unit and $v/4F_b$ for the second, in which v is the propagation rate of surface waves.

* * * * *